US010944330B1

(12) United States Patent
Lee et al.

(10) Patent No.: US 10,944,330 B1
(45) Date of Patent: Mar. 9, 2021

(54) SELF-BIASED GATE DRIVER ARCHITECTURE

(71) Applicant: Cypress Semiconductor Corporation, San Jose, CA (US)

(72) Inventors: Myeongseok Lee, Campbell, CA (US); Murtuza Lilamwala, San Jose, CA (US); Anup Nayak, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/024,538

(22) Filed: Sep. 17, 2020

Related U.S. Application Data

(60) Provisional application No. 62/950,592, filed on Dec. 19, 2019.

(51) Int. Cl.
*H02M 3/335* (2006.01)
*H02M 1/08* (2006.01)
*H02M 1/088* (2006.01)

(52) U.S. Cl.
CPC ......... *H02M 3/33576* (2013.01); *H02M 1/08* (2013.01); *H02M 1/088* (2013.01)

(58) Field of Classification Search
CPC .................................. H02M 1/32; H02M 1/36
See application file for complete search history.

(56) References Cited

U.S. PATENT DOCUMENTS

| 5,999,421 | A  | * | 12/1999 | Liu ................... | H02M 3/33515 |
|           |    |   |         |                      | 363/21.15 |
| 6,445,258 | B1 | * | 9/2002  | Truong .................... | H03B 5/06 |
|           |    |   |         |                      | 331/116 FE |
| 8,482,319 | B1 | * | 7/2013  | Zhang .................... | H03K 17/28 |
|           |    |   |         |                      | 327/108 |
| 9,929,652 | B1 | * | 3/2018  | Ribarich ................. | H02M 1/36 |
| 10,281,943 | B1 | * | 5/2019  | Ho .......................... | G05F 1/575 |
| 2005/0201128 | A1 | * | 9/2005 | Jin ........................ | H02M 3/335 |
|           |    |   |         |                      | 363/56.01 |
| 2008/0088342 | A1 | * | 4/2008 | Lee ................ | H03K 19/018528 |
|           |    |   |         |                      | 326/83 |
| 2008/0246456 | A1 | * | 10/2008 | Djenguerian ..... | H02M 3/33523 |
|           |    |   |         |                      | 323/302 |
| 2011/0261596 | A1 | * | 10/2011 | Zong ................. | H02M 3/33507 |
|           |    |   |         |                      | 363/21.13 |
| 2011/0305047 | A1 | * | 12/2011 | Jungreis ............ | H02M 3/33523 |
|           |    |   |         |                      | 363/21.02 |
| 2013/0051088 | A1 | * | 2/2013 | Yamashita .............. | H02M 1/36 |
|           |    |   |         |                      | 363/21.13 |

(Continued)

*Primary Examiner* — Yusef A Ahmed (57) ABSTRACT

A system includes a primary field effect transistor (FET) coupled to a primary winding on a primary side of an alternating current-to-direct current (AC-DC) converter. The system also includes a gate driver, coupled to the primary FET, that is to, in response to a signal received from a startup controller of the AC-DC converter, turn on the primary FET. The gate driver includes a voltage bias p-type metal-oxide-semiconductor (VBP) buffer coupled between an external supply voltage and a VBP portion of driving chain circuitry, the driving chain circuitry to drive a gate of the primary FET. The gate driver also includes a voltage bias n-type metal-oxide-semiconductor (VBN) buffer coupled between a VBN regulator, which generates an internal supply voltage, and a VBN portion of the driving chain circuitry.

19 Claims, 4 Drawing Sheets

(56) References Cited

U.S. PATENT DOCUMENTS

| | | | |
|---|---|---|---|
| 2014/0063875 A1* | 3/2014 | Al-Shyoukh | H02M 1/36 363/49 |
| 2015/0023069 A1* | 1/2015 | Zhu | H02M 1/08 363/21.16 |
| 2015/0023072 A1* | 1/2015 | Al-Shyoukh | H02M 1/36 363/49 |
| 2015/0117065 A1* | 4/2015 | Cha | H03K 17/063 363/21.01 |
| 2016/0261199 A1* | 9/2016 | Adragna | H02M 1/42 |
| 2016/0352231 A1* | 12/2016 | Quigley | H02M 1/36 |
| 2017/0110962 A1* | 4/2017 | Chang | H02M 1/14 |
| 2017/0176773 A1* | 6/2017 | Whitney | G02C 7/101 |
| 2018/0181158 A1* | 6/2018 | Kanjavalappil Raveendranath | G05F 5/00 |
| 2019/0013740 A1* | 1/2019 | Lin | H02M 3/33507 |
| 2019/0036450 A1* | 1/2019 | Szczeszynski | H02M 1/08 |
| 2019/0058394 A1* | 2/2019 | Neidorff | H02M 3/155 |
| 2019/0207505 A1* | 7/2019 | Ramadass | H02M 3/158 |
| 2020/0153338 A1* | 5/2020 | Ribarich | H02M 1/0061 |
| 2020/0162069 A1* | 5/2020 | Wu | H02M 3/158 |

* cited by examiner

SELF-BIASED GATE DRIVER ARCHITECTURE

RELATED APPLICATIONS

This application claims the benefit of priority of U.S. Provisional Application No. 62/950,592, filed on Dec. 19, 2019, which is incorporated by reference herein in its entirety.

BACKGROUND

Various electronic devices (e.g., such as smartphones, tablets, notebook computers, laptop computers, hubs, chargers, adapters, etc.) are configured to transfer power through Universal Serial Bus (USB) connectors according to USB power delivery protocols defined in various revisions of the USB Power Delivery (USB-PD) specification. Alternating current to direct current (AC-DC) converters convert power from an alternating current (AC) source to a direct current (DC) at a specified voltage level. These AC-DC converters can be adapted to include USB-PD control that enables manufacturers to build a reliable, efficient, and cost-effective power adapter for a growing USB type-C charger market.

BRIEF DESCRIPTION OF THE DRAWINGS

The disclosure is illustrated by way of example, and not of limitation, in the figures of the accompanying drawings.

DETAILED DESCRIPTION

The following description sets forth numerous specific details such as examples of specific systems, components, methods, and so forth, in order to provide a good understanding of various embodiments of the techniques described herein for performing startup of an alternating current to direct current (AC-DC) converter using a self-based gate driver architecture within a primary controller of the AC-DC converter. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the scope of the present disclosure.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the disclosure. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Described herein are various embodiments of techniques for performing startup of an AC-DC converter using a self-based gate driver architecture within a primary controller of the AC-DC converter. For example, a primary field effect transistor (FET) can be coupled between a primary winding on a primary side of the AC-DC converter and the primary side controller. A gate driver, also of the primary side controller, is coupled to a gate of the primary FET to turn on, in response to a signal received from a startup controller of the primary side controller, the primary FET at startup when the secondary side is not active. Thus, the startup controller and the gate driver work together to initiate the AC-DC converter, along with a number of other functions performed by the primary side controller.

In conventional gate drivers, internal regulators directly power pre-driver circuits. These regulators are powered by an external voltage source (V_EXT). The gate-driving circuits consume high currents and experience fast-switching transient currents. These conventional internal regulators provide power to not only driving chains of the gate driver, but also other internal circuitries of the primary side controller. A voltage bias n-type metal-oxide-semiconductor (VBN) node fluctuates significantly due to noise caused by the fast switching current of a VBN portion of driving chain circuitry, and as a result, downgrades the performance of the internal circuitries. Further, a voltage bias p-type metal-oxide-semiconductor (VBP) node fluctuates significantly due to noise caused by the fast switching current of a VBP portion of the driving chain circuitry, and as a result, downgrades the performance of the gate driver. One design approach to reduce this noise is to employ capacitors between the regulators and the driving chain circuitry. Capacitors, however, take up significant chip space, are inefficient, and cause startup delay.

To resolve these and other deficiencies, the present embodiments disclose the use of voltage supply buffers between the internal regulators and the driving chain circuitry of the gate driver. For example, in one embodiment, a VBN buffer is coupled between a VBN regulator, which generates an internal supply voltage, and a VBN portion of the driving chain circuitry. Further, a voltage bias p-type metal-oxide-semiconductor (VBP) buffer is coupled between an external supply voltage and a VBP portion of driving chain circuitry, the driving chain circuitry to drive a gate of the primary FET. Each of the VBN buffer and the VBP buffer can employ, for example, one or more FET and one or more current sources in order to buffer the external supply voltage and the internal supply voltage from the driving chain circuitry of the gate driver. The embodiments described herein can also be implemented in other types of power adapters, power converters, power delivery circuits, or the like.

Figure 1:
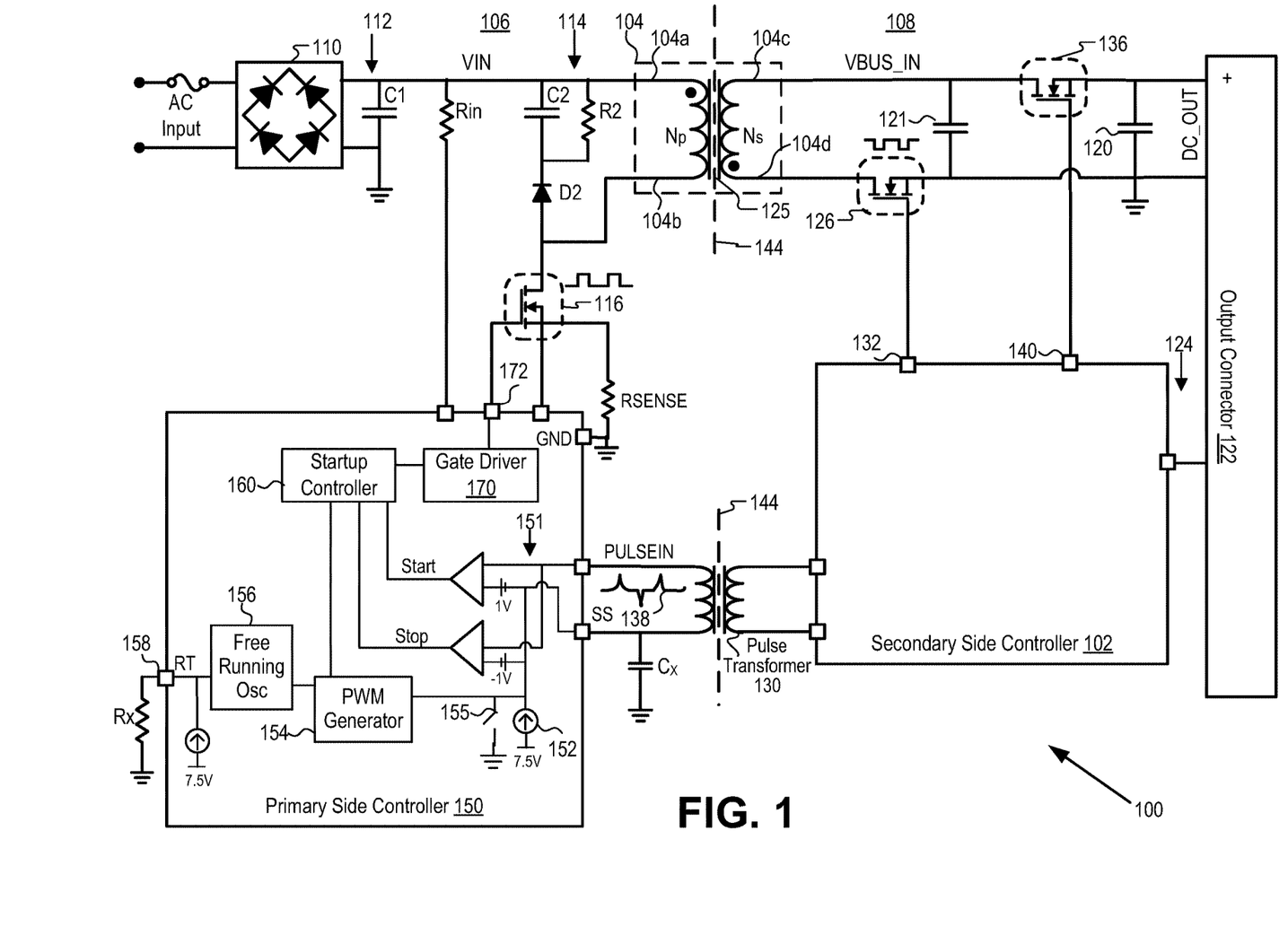
FIG. 1 is a schematic block diagram of an AC-DC converter in which a primary side controller reacts to a signals from a secondary side during startup according to various embodiments.

FIG. 1 is a schematic block diagram of an AC-DC converter 100 in which a primary side controller 150 reacts to a signals from a secondary side during startup according to various embodiments. In various embodiments, the AC-DC converter 100 is an apparatus or part of an electronic device that includes charging capability, such as, for example, laptop power supplies, a multi-outlet power strip, wall sockets with USB-PD type-C sockets, and the like. In some embodiments, the AC-DC converter 100 includes a transformer 104 having a primary winding ($N_P$) on a primary side 106 electrically connected or coupled to an AC input, and a secondary winding ($N_S$) on a secondary side 108 coupled to a DC output.

In various embodiments, on the primary side 106, a rectifying circuit, such as a bridge rectifier 110, and one or more input filters 112, 114, is coupled to a first terminal 104a of the transformer 104 to rectify an AC input voltage and supply input power to the primary winding of the transformer 104. The input filters can include a first input filter 112 having a capacitor (C1) coupled to or across an output of the rectifier 110, and a second, RC filter 114 including a resistor or resistive element (R2) and a capacitor (C2) coupled in parallel between the first terminal 104a of the transformer 104 and a cathode of a diode or rectifier (D2) having an anode coupled to a second terminal 104b of the transformer.

In some embodiments, the AC-DC converter 100 further includes a power switch, such as a primary field effect transistor (FET) 116 having a first or drain node coupled to the second terminal 104b of the transformer 104, a second or gate node coupled to the primary side controller 150, and a third or source node coupled to the primary side controller 150 and, through a current sensing element, such as a resistive element ($R_{SENSE}$) to ground to sense a primary side current flowing through the primary winding when the primary FET 116 is closed or conducting. Generally, as in the embodiment shown, the primary side controller 150 is further coupled to the first terminal 104a of the transformer 104 through a resistive element (Rin) to receive a voltage or signal equal or proportional to the rectified AC input voltage.

On the secondary side 108, the AC-DC converter 100 includes a filter capacitor 121 coupled between a third terminal 104c of the transformer 104 and an electrical ground or ground terminal, and an output capacitor 120 coupled between a third terminal 104c of the transformer 104 and an electrical ground provide a DC output voltage to an output interface or connector 122. The output connector 122 can further be coupled to the secondary side controller 102 through a number of communication channels 124 to support various charging protocols. Suitable output connectors 122 can include those compatible with and supporting standard and proprietary charging protocols including Universal Serial Bus Power Delivery USB PD2.0 and USB PD3 with Programmable Power Supply (PPS), Qualcomm® Quick Charge, Samsung® AFC, and Apple® charging protocols. For example, the connector can include a Universal Serial Bus type C (USB-C) compatible connector where the AC-DC converter 100 is compliant with the USB protocol to provide a DC output voltage of about 3.3 VDC to about 21.5 VDC at a current of from about 0 to about 5000 milliamps (mA).

In various embodiments, the AC-DC converter 100 further includes, on the secondary side 108, a synchronous rectifier such as a synchronous rectifier (SR) FET 126, coupled between a fourth terminal 104d of the transformer 104 and the ground terminal of the DC output. The SR FET 126 includes a first or drain node coupled to the fourth terminal 104d of the transformer 104 and the secondary side controller 102 to sense a voltage on the drain of the SR FET 126; a second or gate node coupled to the secondary side controller to drive or control the SR FET 126; and a third or source node coupled to the secondary side controller and the ground terminal of the DC output. The gate node of the SR FET 126 can be coupled to an SR-drive pin 132 of the secondary side controller 102.

Optionally, as in the embodiment shown, the secondary side further includes an additional or secondary switch 136, such as a NFET, coupled between the third terminal 104c of the transformer 104 and a positive DC output to enable the secondary side controller 102 to turn off the DC output to protect against over voltage and/or under voltage conditions. The secondary switch 136 includes a source node coupled to a voltage bus in pin ($V_{BUS\_IN}$) of the secondary side controller 102; a gate node coupled to a voltage bus control pin ($V_{BUS\_CTRL}$) 140 to drive or control the SS; and a drain node coupled to a voltage bus out pin ($V_{BUS\_OUT}$) and to the positive terminal of the DC output. (Not all pins illustrated.)

In various embodiments, the AC-DC converter 100 further includes an isolation circuit or galvanic isolation barrier 144 to electrically isolate the secondary side 108 from the high AC input voltage present on the primary side 106. Because the transformer 104 is a step down transformer, the transformer 104 is generally considered part of the galvanic isolation barrier 144. For example, the galvanic isolation barrier 144 can include an auxiliary coil 125 of the transformer 104, which functions as a flyback step-down transformer to provide power to the primary side controller 150 via an Auxiliary (or "Aux") pin (not illustrated). Further, the flyback step-down transformer can provide a signal to the primary side controller 150 from pins on the secondary side controller 102, such as a feedback pin or pulse width modulation (PWM) drive pin (not illustrated). The galvanic isolation barrier 144 can further include additional circuits or elements between the secondary side controller 102 and the primary side controller 150 or the primary FET 116.

In corresponding embodiments, when the primary side power switch (e.g., the primary FET 116) is closed, the primary side 106 of the flyback transformer is connected to the input voltage source. In this embodiment, the primary side 106 of the flyback transformer is coupled to the bridge rectifier 110. As the primary current and magnetic flux in the flyback transformer increases, energy is stored in the transformer core of the flyback transformer. The voltage induced in the secondary winding is negative and blocked by the secondary side power switch (e.g., the SR FET 126). When the primary FET 116 is opened, the primary current and magnetic flux drop. The secondary voltage is positive, allowing current to flow from the flyback transformer. The energy stored in the transformer 104 is transferred to an output load, such as a USB charging device. The output capacitor 120 can be used to supply energy to the output load when the primary FET 116 is engaged. Thus, the flyback transformer, based on control of the primary FET 116, can store energy and transfer the energy to the output of the AC-DC converter 100.

The primary side controller 150 can be implemented as an integrated circuit (IC) that is included as a component within the AC_DC converter 100. The primary side controller 150 can be configured to receive a control (or pulse) signal 138 as one or more pulses, via a pulse transformer 130, from the secondary side controller 102 across the galvanic isolation barrier 144. The pulse signal 138 can be received through a PULSEIN pin. The primary side controller 150 can include a receiver 151 and a pulse width modulation (PWM) generator 154 to receive the pulse signal 138 from the secondary-side controller 150. The primary side controller 150 can further include a free running oscillator 156 that supplies free running pulses to the PWM generator 154, so that the PWM generator 154 can generate a free running PWM signal when the secondary side 108 is not active. The receiver 151 and PWM generator 154 can change the primary-side turn-on pulse based on output of the flyback transformer (e.g., error amplifier (EA) output) of the secondary side controller 102. The primary-side turn-on pulse can be used to turn on the primary FET 116 as will be explained.

In disclosed embodiments, the primary side controller 150 can also include a gate driver 170 and a startup controller 160. The startup controller 160 is coupled to the receiver 151, the PWM generator 154, and the gate driver 170 to drive a gate of the primary FET 116 via a gate driver pin 172. For example, the startup controller 160 can transmit a signal generated by the PWM generator 154 to the gate driver 170 to turn on the primary FET 116. In this way, the gate driver 170 can turn on the primary FET 116 when the secondary side 108 is not active.

In one embodiment, the primary side controller 150, in order to apply the pulse signal 138 to the primary side FET 116, is configured to receive a turn-on pulse from the secondary side controller 102. The startup controller 160 can apply the turn-on pulse to the gate of the primary FET 116 via the gate driver 170. The turn-on pulse causes the primary drain of the primary FET 116 to go low, e.g., a first voltage level corresponding to a first state or representing the digital value of one. Subsequently, the primary side controller 150 receives a turn-off pulse from the secondary side controller 102. The startup controller 160 can apply the turn-off pulse to the gate of the primary FET 116 via the gate driver 170. The turn-off pulse causes the primary drain of the primary FET 116 to go high, e.g., a second voltage level corresponding to a second state or representing the digital value of zero.

With additional specificity and further reference to the primary side controller 150, the PWM generator 154, with the use of the free running oscillator 156, supports a soft start by gradually increasing the duty cycles from $D/C_{min}$ to $D/C_{max}$ using an external capacitor (Cx) connected to a soft start (SS) pin. The duration for the free running PWM generation can be set by the external capacitor (Cx). An internal, e.g., 5 microampere, current source 152 can charge the external capacitor (Cx). The PWM generator 154 can set a maximum amplitude for the soft start, e.g., between 3 and 4 volts (e.g., 3.75 V). A frequency ($F_{OSC}$) of the free running oscillator 156 can be set by an external resistor (Rx) of between 400 and 600 kilo-ohm (Ku) (e.g., 500 KΩ) connected externally to a timing resistor (RT) pin 158. A discharge switch 155 can discharge the external capacitor (Cx) after startup is complete. This cycle can be repeated with an auto-restart timer added between each soft start.

Additionally, the primary side controller 150 can function to synchronize the secondary side pulses on the PULSEIN pin when the secondary side 108 becomes active. The PWM signal from the secondary side 108 can be coupled to the primary side using the pulse transformer 130. The pulse transformer 130 can ensure proper frequency response and should have just an adequate Q-factor to avoid excessive overshoot in passing the PWM signal. The pulse width can be measured on the PULSEIN pin. The positive pulse from the pulse transformer 130 indicates a start of the PWM signal and a negative pulse from the pulse transformer 130 indicates a stop of the PWM. A set of comparators in the receiver 151 can be adapted to detect whether an incoming pulse is positive or negative. This information (positive or negative on the incoming pulse) can be sent to the startup controller 160 for proper timing in enabling the gate driver 170 to drive the primary FET 116.

Figure 2:
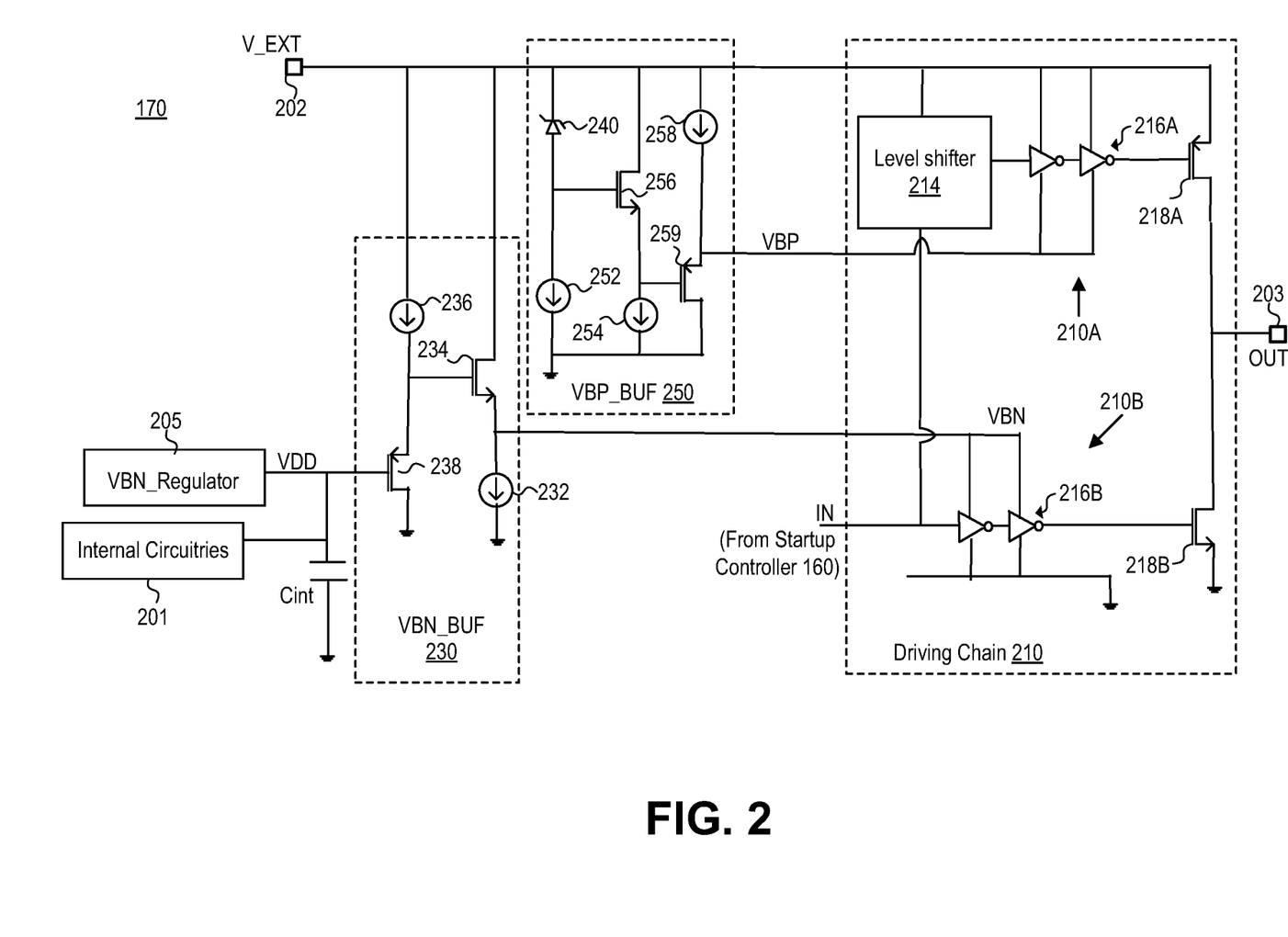
FIG. 2 is a schematic block diagram of a gate driver of the primary side controller according to another embodiment.

FIG. 2 is a schematic block diagram of the gate driver 170 of the primary side controller 150 according to another embodiment. The gate driver 170, in various embodiments, includes, but is not limited to, internal circuitries 201, an external supply voltage (V_EXT) accessible via an external supply voltage terminal 202, an output signal (OUT) provided to a gate driver (GD) terminal 203, and an n-type metal-oxide-semiconductor (VBN) regulator 205 to provide an internal power supply (VDD). In one embodiment, the GD terminal 203 is the gate driver pin 172 of FIG. 1. The external supply voltage (V_EXT) can be a generally larger voltage such as between 13 and 17 volts, with a typical value being around 15 volts. The internal power supply (VDD) can be generally a smaller voltage, such as half of the external supply voltage (V_EXT) to power the internal circuitries 201. An internal capacitor ($C_{int}$) can be coupled between the internal circuitries 201 and ground to provide some additional protection to the internal circuitries 201. This internal capacitor is of relative small size, e.g., between 60 and 80 picofarads.

The gate driver 170 can further include driving chain circuitry 210 that includes a voltage bias p-type metal-oxide-semiconductor (VBP) portion 210A and a voltage bias n-type metal-oxide-semiconductor (VBN) portion 210B. The VBP portion 210A can include a first set of inverters 216A, a level shifter 214 coupled to an input of the first set of inverters, and a p-type metal-oxide-semiconductor (PMOS) FET (or PFET) 218A. A gate of the PFET 218A is coupled to an output of the first set of inverters 216A. The VBN portion 210B can include a second set of inverters 216B and an n-type metal-oxide-semiconductor (NMOS) FET (or NFET) 218B. A gate of the NFET 218B is coupled to an output of the second set of inverters 216B. The VBN regulator 205 can power the second set of inverters 216B and the external voltage supply can power the first set of inverters 216A. An output of each of the PFET 218A and the NFET 218B can be connected to the GD terminal 203 at the output.

In various embodiments, an input (IN) of the second set of inverters 216B can come from an output of the startup controller 160 of the primary side controller 150. In embodiments, the level shifter 214 is adapted to shift up (or adjust) this input signal to an adjusted voltage input signal. For instance, if the input signal at the second set of inverters 216B is between 11V and 7.5V, the level shifter 214 can adjust the voltage signal to between 15V and 7.5V. This adjusted voltage signal can be input into the first set of inverters 216A of the VBP portion 210A of the driving chain circuitry 210.

As was discussed, a VBN node of the gate driver 170 fluctuates significantly due to noise caused by the fast switching current of the VBN portion 210B of the driving chain circuitry 210, and as a result, downgrades the performance of the internal circuitries 201. Further, a VBP node fluctuates significantly due to noise caused by the fast switching current of the VBP portion 210A of the driving chain circuitry 210, and as a result, downgrades the performance of the gate driver 170.

In various embodiments, instead of employing extra external capacitors and/or a VBP regulator, and otherwise save on circuit area of the gate driver 170, the gate driver 170 is configured to include a VBN buffer 230 coupled between the VBN regulator 205, which generates the internal supply voltage (VDD), and the VBN portion 210B of the driving chain circuitry 210. The gate driver 170 can further be configured to include a VBP buffer 250 coupled between the external voltage supply and the VBP portion 210A of the driving chain circuitry 210. In this way, the VBN regulator 205 is also protected from collapsing due to conventionally not being able to support the high and fast transient switching current of the driving chain circuitry 210. The VBN buffer 230 and the VBP buffer 250 protect the VDD node by isolating glitches and other noise of the VBP and VBN nodes. This implementation includes no capacitor coupled between the VBP buffer 250 and the VBP portion 210A of the driving chain circuitry 210 or between the VBN buffer 230 and the VBN portion 210B of the driving chain circuitry.

In one embodiment, the VBN buffer 230 includes a first current source 232 coupled to ground and an n-type metal-oxide-semiconductor (NMOS) FET 234. The NMOS FET 234 includes a first drain coupled to the external supply voltage (V_EXT), a first source coupled to the first current source 232 and to the VBN portion 210B of the driving chain circuitry 210, and a first gate coupled to the internal supply voltage (VDD) received from the VBN regulator 205.

In a further embodiment, the VBN buffer 230 further includes a second current source 236 coupled to the external supply voltage (V_EXT) and a p-type metal-oxide-semiconductor (PMOS) FET 238. The PMOS FET 238 can include a second source coupled to the second current source 236, a second drain coupled to ground, and a second gate coupled to the internal supply voltage (VDD) received from the VBN regulator 205. In this further embodiment, the first gate of NMOS FET 234 is coupled between the second current source 236 and the second source of the PMOS FET 238.

In one embodiment, the VBP buffer 250 includes a Zener diode 240 coupled to the external supply voltage (V_EXT), a first current source 252 coupled between the Zener diode 240 and ground, a second current source 254 coupled to ground in parallel to the first current source 252, and an n-type metal-oxide-semiconductor (NMOS) FET 256. The NMOS FET 256 can include a first drain coupled to the external supply voltage (V_EXT), a first source coupled to the second current source 254 and to the VBP portion 210A of the driving chain circuitry 210, and a first gate coupled to the Zener diode 240 and to the first current source 252.

In a further embodiment, the VBP buffer 250 further includes a third current source 258 coupled to the external supply voltage (V_EXT) and a p-type metal-oxide-semiconductor (PMOS) FET 259. The PMOST FET 259 can include a second source coupled to the third current source 258 and to the VBP portion 210A of the driving chain circuitry 210, a second drain coupled to ground, and a second gate coupled to the first source and the second current source 254 of the VBP buffer 250.

Figure 3:
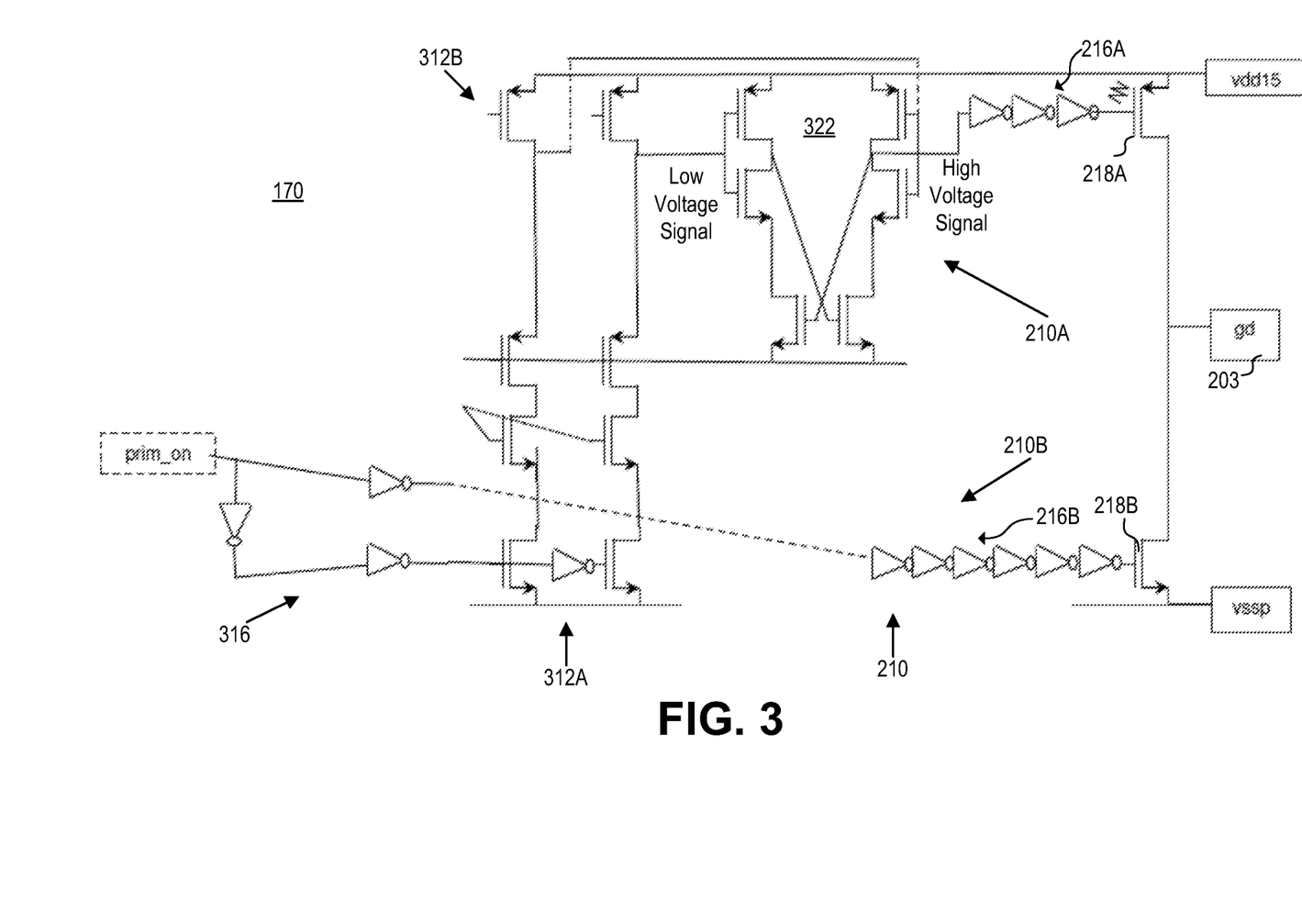
FIG. 3 is a schematic block diagram of aspects of the gate driver according to various embodiments.

FIG. 3 is a schematic block diagram 300 of aspects of the gate driver 170 according to various embodiments. The schematic block diagram 300 is a simplified version of the gate driver 170 in not illustrating the VBN buffer 230 or the VBP buffer 250, in order to illustrate additional circuitry.

For example, the second set of inverters 216B of the second portion 210B of the driving chain circuitry 210 can be a longer string of inverters. The second set of inverters 216B can be turned on in response to an input signal received at a primary on pin ("prim_on"), e.g., the signal received from the startup controller 160 of the primary side controller 150.

Further, the first set of inverters 216A can also be a longer string of inverters. The VBP portion 210A of the driving chain circuitry 210 can further include a series of NMOS FETS 312A followed by a series of PMOS FETS 312B, which are coupled to a latch circuit 322 before being coupled to the first set of inverters 216A. A set of input inverters 316 can be coupled to gates of the bottommost NMOST FETS 312A to receive the input signal from the primary on pin ("prim_on"). Drains of the top-most PMOS FETS 312B can be coupled to respective gates of FETS of the latch circuit 322. The latch circuit 322 can amplify the input signal from a low swing signal (e.g., 4V at the drains of top-most PMOS FETS 312B) to a full swing signal (e.g., 7.5V). In this way, the input signal driving the first set of inverters 216A of the first portion 210A of the driving chain circuitry 210 is a full swing signal. Different embodiments of the gate driver 170 are envisioned that include additional or fewer components.

In various embodiments, the gate driver 170 receives the free running PWM signal from the PWM generator 154 through the primary on pin ("prim_on") when the secondary side 108 is not active. When the secondary side 108 is active, the PWM signal from the secondary side 108 controls the gate driver 170. The startup controller 160 can control the input signal sent to the primary on pin of the gate driver 170 in order to turn on the primary FET 116 during initial startup (when the secondary side is not active) and during active control (when the secondary side is active).

Figure 4:
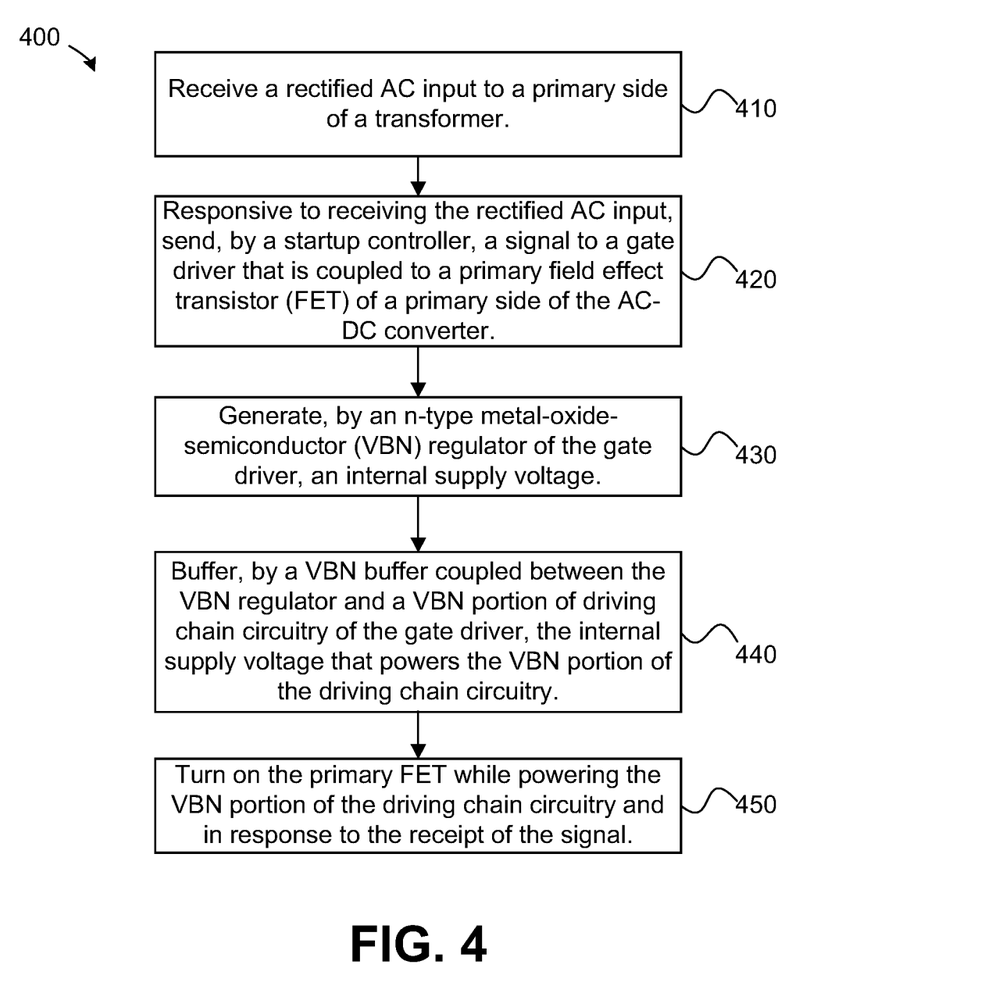
FIG. 4 is a flow diagram of a method of operating an AC-DC converter that includes a primary side controller according to one embodiment.

FIG. 4 is a flow diagram of a method 400 of operating an AC-DC converter that includes a primary side controller according to one embodiment. The method 400 can be performed by processing logic that comprises hardware (e.g., circuitry, dedicated logic, programmable logic, microcode, etc.), firmware, or a combination thereof. In one example embodiment, the method 400 is performed by processing logic included in primary side controller 150 of the AC-DC controller 100.

The method 400 can begin with the processing logic receiving (or otherwise detecting) a rectified AC input to a primary side of a transformer (410). The method 400 can continue with the processing logic, responsive to receiving (or detecting) the rectified AC input, sending, by a startup controller, a signal to a gate driver that is coupled to a primary field effect transistor (FET) of a primary side of the AC-DC converter (420). The method 400 can continue with the processing logic generating, by an n-type metal-oxide-semiconductor (VBN) regulator of the gate driver, an internal supply voltage (430). The method 400 can continue with the processing logic buffering, by a VBN buffer coupled between the VBN regulator and a VBN portion of driving chain circuitry of the gate driver, the internal supply voltage that powers the VBN portion of the driving chain circuitry (440). The method 400 can continue with the processing logic turning on the primary FET while powering the VBN portion of the driving chain circuitry and in response to the receipt of the signal (450).

The method 400 can further include the processing logic buffering an external supply voltage by a voltage bias p-type metal-oxide-semiconductor (VBP) buffer coupled between the external supply voltage and a VBP portion of the driving chain circuitry.

The method 400 can further include generating an output to the primary FET by combining a first output of a p-type metal-oxide-semiconductor (PMOS) FET of the VBP portion and a second output of an n-type metal-oxide-semiconductor (NMOS) FET of the VBN portion of the driving chain circuitry. The method 400 can further include the processing logic inputting, to a first gate of the PMOS FET, an output of a first set of inverters powered by the VBP buffer. The method 400 can further include the processing logic inputting, to a second gate of the NMOS FET, an output of a second set of inverters powered by the VBN buffer, wherein each of the first set and the second set of inverters are turned on in response to receipt of the signal.

In the above description, some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "communicating," "modifying," "measuring," "determining," "detecting," "sending," "comparing," "maintaining," "switching," "controlling," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A system comprising:
a primary field effect transistor (FET) coupled to a primary winding on a primary side of an alternating current to direct current (AC-DC) converter; and
a gate driver coupled to the primary FET, the gate driver configured to, in response to a signal received from a startup controller of the AC-DC converter, turn on the primary FET, wherein the gate driver comprises:
  a voltage bias p-type metal-oxide-semiconductor (VBP) buffer coupled between an external supply voltage and a VBP portion of a driving chain circuitry, the driving chain circuitry configured to drive a gate of the primary FET; and
  a voltage bias n-type metal-oxide-semiconductor (VBN) buffer coupled between a VBN regulator, which generates an internal supply voltage, and a VBN portion of the driving chain circuitry, wherein the VBN portion of the driving chain circuitry is powered by the internal supply voltage, and wherein the VBN buffer comprises:
    a first current source coupled to a ground;
    a first n-type metal-oxide-semiconductor (NMOS) FET coupled between the first current source and the external supply voltage, wherein the VBN portion of the driving chain circuitry is coupled between the first current source and the first NMOS FET;
    a first p-type metal-oxide-semiconductor (PMOS) FET coupled to the ground, to the VBN regulator, and to the first NMOS FET; and a second current source coupled to the first NMOS FET and is also coupled between the external supply voltage and the first PMOS FET.

2. The system of claim 1, wherein the VBP portion of the driving chain circuitry comprises a set of inverters coupled between a level shifter and a second PMOS FET, the level shifter to adjust a voltage level of a signal that is input into the set of inverters.

3. The system of claim 1, wherein the VBN portion of the driving chain circuitry comprises a set of inverters coupled between an output of the startup controller and a second NMOS FET.

4. The system of claim 1, wherein the gate driver further comprises internal circuitries that are coupled to the internal supply voltage for power.

5. The system of claim 1, wherein there is no capacitor coupled between the VBP buffer and the VBP portion of the driving chain circuitry or between the VBN buffer and the VBN portion of the driving chain circuitry.

6. The system of claim 1, wherein the first NMOS FET comprises:
 a drain coupled to the external supply voltage;
 a source coupled to the first current source and to the VBN portion of the driving chain circuitry; and
 a gate coupled to the VBN regulator to receive the internal supply voltage.

7. The system of claim 1, wherein the first PMOS FET comprises:
 a source coupled to the second current source and to a gate of the first NMOS FET;
 a drain coupled to the ground; and
 a gate coupled to the VBN regulator to receive the internal supply voltage.

8. The system of claim 1, wherein the VBP buffer comprises:
 a Zener diode coupled to the external supply voltage;
 a third current source coupled between the Zener diode and the ground;
 a fourth current source coupled to the ground in parallel to the third current source; and
 a second NMOS FET comprising:
  a first drain coupled to the external supply voltage;
  a first source coupled to the fourth current source and to the VBP portion of the driving chain circuitry; and
  a first gate coupled to the Zener diode and to the third current source.

9. The system of claim 8, wherein the VBP buffer further comprises:
 a fifth current source coupled to the external supply voltage; and
 a second PMOS FET comprising:
  a second source coupled to the fifth current source and to the VBP portion of the driving chain circuitry;
  a second drain coupled to the ground; and
  a second gate coupled to the first source and the fourth current source.

10. An integrated circuit for a primary side of an alternating current to direct current (AC-DC) converter, the integrated circuit comprising:
 a gate driver comprising:
  a voltage bias n-type metal-oxide-semiconductor (VBN) regulator to generate an internal supply voltage;
  a voltage bias p-type metal-oxide-semiconductor (VBP) buffer coupled between an external supply voltage terminal and a VBP portion of a driving chain circuitry, the driving chain circuitry configured to drive a gate of a primary field effect transistor (FET); and
  a VBN buffer coupled between the VBN regulator and a VBN portion of the driving chain circuitry, wherein the VBN portion of the driving chain circuitry is powered by the internal supply voltage, and wherein the VBN buffer comprises:
   a first current source coupled to a ground;
   a first n-type metal-oxide-semiconductor (NMOS) FET coupled between the first current source and the external supply voltage, wherein the VBN portion of the driving chain circuitry is coupled between the first current source and the first NMOS FET;
   a first p-type metal-oxide-semiconductor (PMOS) FET coupled to the ground, to the VBN regulator, and to the first NMOS FET; and
   a second current source coupled to the first NMOS FET and is also coupled between the external supply voltage and the first PMOS FET; and
 a startup controller coupled to transmit a signal to the gate driver to turn on the primary FET.

11. The integrated circuit of claim 10, wherein the gate driver further comprises
 internal circuitries that are coupled to the VBN regulator to be powered by the internal supply voltage.

12. The integrated circuit of claim 10, wherein the VBP portion of the driving chain circuitry comprises a set of inverters coupled between a level shifter and a second PMOS FET, the level shifter to adjust a voltage level of a signal that is input into the set of inverters.

13. The integrated circuit of claim 10, wherein the VBN portion of the driving chain circuitry comprises a set of inverters coupled between an output of the startup controller and second NMOS FET.

14. The integrated circuit of claim 10, wherein the first NMOS FET comprises:
 a drain coupled to the external supply voltage terminal;
 a source coupled to the first current source and to the VBN portion of the driving chain circuitry; and
 a gate coupled to the VBN regulator to receive the internal supply voltage.

15. The integrated circuit of claim 10, wherein the first PMOS FET comprises:
 a source coupled to the second current source and to a gate of the first NMOS FET;
 a drain coupled to the ground; and
 a gate coupled to the VBN regulator to receive the internal supply voltage.

16. The integrated circuit of claim 10, wherein the VBP buffer comprises:
 a Zener diode coupled to the external supply voltage terminal;
 a third current source coupled between the Zener diode and the ground;
 a fourth current source coupled to the ground in parallel to the third current source; and
 a second NMOS FET comprising:
  a first drain coupled to the external supply voltage terminal;
  a first source coupled to the fourth current source and to the VBP portion of the driving chain circuitry; and
  a first gate coupled to the Zener diode and to the third current source.

17. The integrated circuit of claim 16, wherein the VBP buffer further comprises:

a fifth current source coupled to the external supply voltage terminal; and a second PMOS FET comprising:
   a second source coupled to the fifth current source and to the VBP portion of the driving chain circuitry;
   a second drain coupled to the ground; and
   a second gate coupled to the first source and the fourth current source.

18. A method of operating an alternating current to direct current (AC-DC) converter, the method comprising:
   receiving a rectified AC input to a primary side of a transformer;
   responsive to receiving the rectified AC input, sending, by a startup controller, a signal to a gate driver that is coupled to a primary field effect transistor (FET) of a primary side of the AC-DC converter;
   buffering an external supply voltage by a voltage bias p-type (VBP) buffer coupled between the external supply voltage and a VBP portion of a driving chain circuitry;
   generating, by a voltage bias n-type (VBN) regulator of the gate driver, an internal supply voltage;
   buffering, by a VBN buffer coupled between the VBN regulator and a VBN portion of the driving chain circuitry of the gate driver, the internal supply voltage that powers the VBN portion of the driving chain circuitry, wherein the VBN buffer comprises:
      a first current source coupled to a ground;
      a first n-type metal-oxide-semiconductor (NMOS) FET coupled between the first current source and the external supply voltage, wherein the VBN portion of the driving chain circuitry is coupled between the first current source and the first NMOS FET;
      a first p-type metal-oxide-semiconductor (PMOS) FET coupled to the ground, to the VBN regulator, and to the first NMOS FET; and
      a second current source coupled to the first NMOS FET and is also coupled between the external supply voltage and the first PMOS FET; and
   turning on the primary FET while powering the VBN portion of the driving chain circuitry and in response to receipt of the signal.

19. The method of claim 18, further comprising:
   generating an output to the primary FET by combining a first output of a second PMOS FET of the VBP portion and a second output of a second NMOS FET of the VBN portion of the driving chain circuitry;
   inputting, to a first gate of the second PMOS FET, an output of a first set of inverters powered by the VBP buffer; and
   inputting, to a second gate of the second NMOS FET, an output of a second set of inverters powered by the VBN buffer, wherein each of the first set and the second set of inverters are turned on in response to receipt of the signal.

* * * * *